(12) United States Patent
Stadler et al.

(10) Patent No.: US 12,334,405 B2
(45) Date of Patent: Jun. 17, 2025

(54) ELECTRONIC DEVICES INCLUDING VENT OPENINGS AND ASSOCIATED METHODS

(71) Applicant: Infineon Technologies AG, Neubiberg (DE)

(72) Inventors: Michael Stadler, Munich (DE); Thomas Bemmerl, Schwandorf (DE)

(73) Assignee: Infineon Technologies AG, Neubiberg (DE)

(*) Notice: Subject to any disclaimer, the term of this patent is extended or adjusted under 35 U.S.C. 154(b) by 7 days.

(21) Appl. No.: 18/211,898

(22) Filed: Jun. 20, 2023

(65) Prior Publication Data

US 2023/0420317 A1 Dec. 28, 2023

(30) Foreign Application Priority Data

Jun. 28, 2022 (DE) .................... 10 2022 116 039.4

(51) Int. Cl.
| | |
|---|---|
| H01L 23/16 | (2006.01) |
| B23K 1/00 | (2006.01) |
| B23K 101/42 | (2006.01) |
| H01L 21/56 | (2006.01) |
| H01L 21/60 | (2006.01) |
| H01L 23/00 | (2006.01) |
| H01L 23/31 | (2006.01) |
| H01L 23/495 | (2006.01) |
| H05K 3/34 | (2006.01) |

(52) U.S. Cl.
CPC ............ *H01L 23/16* (2013.01); *B23K 1/0016* (2013.01); *H01L 21/56* (2013.01); *H01L 23/3107* (2013.01); *H01L 23/315* (2013.01); *H01L 23/49503* (2013.01); *H01L 23/49575* (2013.01); *H01L 24/81* (2013.01); *H05K 3/3431* (2013.01); *B23K 2101/42* (2018.08); *H01L 2021/60007* (2013.01); *H01L 2021/60022* (2013.01); *H01L 2924/15151* (2013.01); *H01L 2924/3511* (2013.01); *H05K 2203/1178* (2013.01)

(58) Field of Classification Search
CPC .................. H01L 24/81; H01L 23/315; H01L 2021/60007; H01L 2021/60022; H01L 2924/3511; H01L 2924/15151; H05K 2203/1178

See application file for complete search history.

(56) References Cited

U.S. PATENT DOCUMENTS

| | | |
|---|---|---|
| 8,951,037 B2 | 2/2015 | Jang et al. |
| 10,396,005 B2 | 8/2019 | Kim |
| 10,672,626 B2 | 6/2020 | Karhade et al. |
| 10,770,403 B2 | 9/2020 | Han et al. |
| 2009/0026656 A1 | 1/2009 | Bautista, Jr. et al. |
| 2012/0032328 A1* | 2/2012 | Lin ................ H01L 23/4985 257/E21.503 |
| 2014/0061883 A1 | 3/2014 | Bowles et al. |

(Continued)

*Primary Examiner* — David A Zarneke
(74) *Attorney, Agent, or Firm* — Dicke, Billig & Czaja, PLLC

(57) ABSTRACT

An electronic device and method is disclosed. In one example, the electronic device includes a solderable surface and at least one surface opening arranged in the solderable surface. The electronic device further includes an encapsulation material, encapsulating at least one electronic component of the electronic device, and at least one vent opening arranged in an area of the surface opening and extending through the encapsulation material.

22 Claims, 5 Drawing Sheets

(56) References Cited

U.S. PATENT DOCUMENTS

| | | |
|---|---|---|
| 2016/0095227 A1* | 3/2016 | Takano ................ H05K 3/4635 156/247 |
| 2018/0166366 A1 | 6/2018 | Fuergut et al. |
| 2019/0189797 A1 | 6/2019 | Zommer |
| 2022/0148934 A1 | 5/2022 | Fuergut et al. |

* cited by examiner

ELECTRONIC DEVICES INCLUDING VENT OPENINGS AND ASSOCIATED METHODS

CROSS-REFERENCE TO RELATED APPLICATION

This Utility Patent application claims priority to German Patent Application No. 10 2022 116 039.4 filed Jun. 28, 2022, which is incorporated herein by reference.

TECHNICAL FIELD

The present disclosure relates to electronic devices including vent openings. In addition, the present disclosure relates to methods for manufacturing such electronic devices and methods for soldering such electronic devices to a printed circuit board.

BACKGROUND

Electronic devices may be mounted on printed circuit boards based on various techniques. For example, an electronic device may be soldered to a printed circuit board based on a soldering process. This may lead to two undesirable effects: first, solder voids may form, and/or second, warpage of one or multiple device components may occur due to CTE mismatch. Manufacturers of electronic devices are constantly striving to improve their products. In particular, it may be desirable to provide electronic devices with reduced solder voids and less warpage. In this connection, it may further be desirable to provide methods for manufacturing such electronic devices and methods for soldering such electronic devices to a printed circuit board.

SUMMARY

An aspect of the present disclosure relates to an electronic device. The electronic device comprises a solderable surface and at least one surface opening arranged in the solderable surface. The electronic device further comprises an encapsulation material, encapsulating at least one electronic component of the electronic device, and at least one vent opening arranged in an area of the surface opening and extending through the encapsulation material.

An aspect of the present disclosure relates to a method for soldering an electronic device to a printed circuit board. The method comprises arranging solder material on a printed circuit board. The method further comprises arranging an electronic device in accordance with the previous aspect over the printed circuit board, wherein the at least one vent opening is arranged over the solder material. The method further comprises performing a soldering act, wherein the at least one vent opening provides an outgassing path for gases generated from the solder material during the soldering act.

An aspect of the present disclosure relates to a method for manufacturing an electronic device. The method comprises providing an opening in a solderable surface of the electronic device. The method further comprises encapsulating at least one electronic component of the electronic device in an encapsulation material. The method further comprises forming at least one vent opening in an area of the surface opening, wherein the at least one vent opening extends through the encapsulation material.

BRIEF DESCRIPTION OF THE DRAWINGS

The accompanying drawings are included to provide a further understanding of aspects. The drawings illustrate aspects and together with the description serve to explain principles of aspects. Other aspects and many of the intended advantages of aspects will be readily appreciated as they become better understood by reference to the following detailed description. The elements of the drawings are not necessarily to scale relative to each other. Like reference numerals may designate corresponding similar parts.

DETAILED DESCRIPTION

In the following detailed description, reference is made to the accompanying drawings, in which are shown by way of illustration specific aspects in which the disclosure may be practiced. In this regard, directional terminology, such as "top", "bottom", "front", "back", etc. may be used with reference to the orientation of the figures being described. Since components of described devices may be positioned in a number of different orientations, the directional terminology may be used for purposes of illustration and is in no way limiting. Other aspects may be utilized and structural or logical changes may be made without departing from the concept of the present disclosure. Hence, the following detailed description is not to be taken in a limiting sense.

Figure 1:
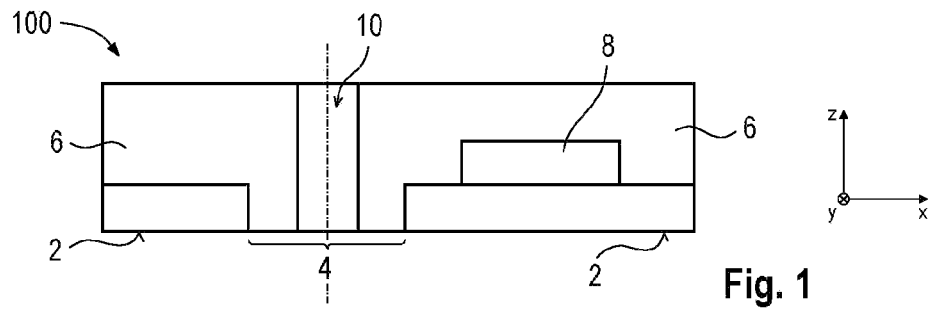
FIG. 1 schematically illustrates a cross-sectional side view of an electronic device in accordance with the disclosure.

FIG. 1 illustrates an electronic device 100 in accordance with the disclosure. The electronic device 100 is described in a general manner in order to qualitatively specify aspects of the disclosure. It is understood that the electronic device 100 may include further aspects. For example, the electronic device 100 may be extended by any of the aspects described in connection with other more detailed examples in accordance with the disclosure.

The electronic device 100 may include a solderable surface 2 and at least one surface opening 4 arranged in the solderable surface 2. For illustrative purposes, a center axis of the surface opening 4 is indicated by a vertical dot-dashed line. In addition, the electronic device 100 may include an encapsulation material 6 encapsulating at least one electronic component 8 of the electronic device 100. At least one vent opening 10 may be arranged in an area of the surface opening 4 and may extend through the encapsulation material 6.

Figure 2A:
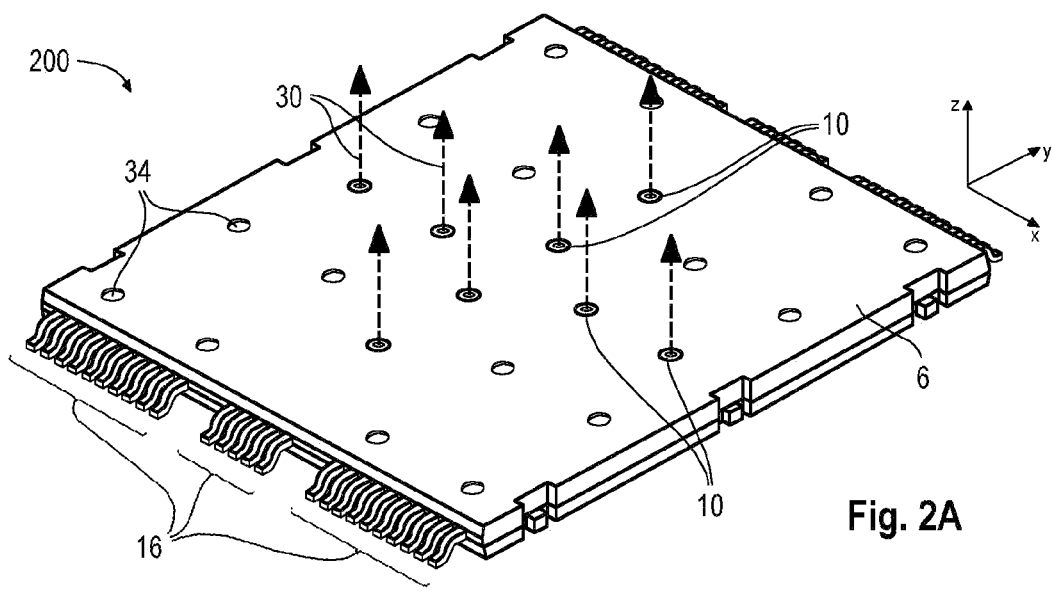
FIG. 2 includes FIGS. 2A and 2B illustrating a perspective top view and a perspective bottom view, respectively, of an electronic device in accordance with the disclosure.
Figure 2B:
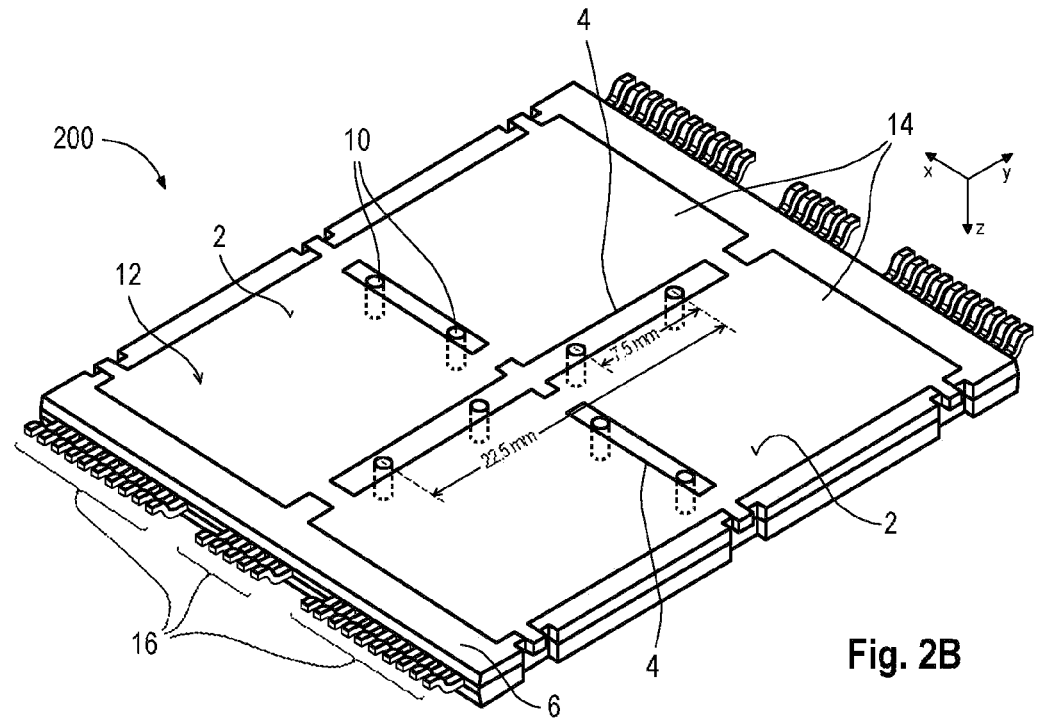

The electronic device 200 of FIG. 2 including FIGS. 2A and 2B may be seen as a more detailed version of the electronic device 100 of FIG. 1. In the example of FIG. 2, the solderable surface 2 may be part of a chip carrier 12. The chip carrier 12 may not be restricted to a specific carrier type. In the example of FIG. 2, the chip carrier 12 may correspond to or may include a leadframe with one or multiple diepads 14 and one or multiple leads (or pins) 16. In further examples, the chip carrier 12 may correspond to or may include at least one of a laminate, a molded interconnect substrate, a ceramic substrate, a DCB (Direct Copper Bonding) substrate, an AMB (Active Metal Bonding or Active Metal Brazing) substrate, etc. In the non-limiting example of FIG. 2, the leadframe may include an exemplary number of four diepads 14 and numerous leads 16 arranged at opposite side surfaces of the encapsulation material 6. The leadframe may e.g. be manufactured from metals and/or metal alloys, in particular at least one of copper, copper alloys, nickel, iron nickel, etc. In further examples (not illustrated), the chip carrier 12 may correspond to or may include a laminate and/or a substrate. The laminate and/or substrate may e.g. be manufactured from an electrically insulating material, such as e.g. a ceramic material, wherein solderable material may be applied on the periphery of the electrically insulating material.

The solderable surface 2 may be arranged at a periphery of the electronic device 200. In the example of FIG. 2, the solderable surface 2 may form or may correspond to the bottom surface of the electronic device 200. In this context, the solderable surface 2 may be configured for soldering the electronic device 200 to a printed circuit board (not illustrated). In the example of FIG. 2, the electronic device 200 may correspond to a surface mount device.

Electronic components of the electronic device 200 may be arranged over a surface of the chip carrier 12 arranged opposite to the solderable surface 2. In particular, the electronic components may be mounted on one or multiple of the diepads 14. The electronic components may be covered by the encapsulation material 6 and may thus be invisible to a viewer of FIG. 2. Note that the electronic components may not be restricted to a specific component type. For example, the electronic components may include one or multiple semiconductor chips (or semiconductor dies) such that the electronic device 200 may also be referred to as semiconductor device.

Semiconductor chips of the electronic device 200 may be manufactured from an elemental semiconductor material (e.g. Si) and/or from a wide band gap semiconductor material or a compound semiconductor material (e.g. SiC, GaN, SiGe, GaAs). In particular, one or multiple of the semiconductor chips may correspond to power semiconductor components and may thus be referred to as power semiconductor chips. In this context, the term "power semiconductor chip" may refer to a semiconductor chip providing at least one of high voltage blocking or high current-carrying capabilities. A power semiconductor chip may be configured for high currents having a maximum current value of a few Amperes, such as e.g. 10 A, or a maximum current value of up to or exceeding 100 A. Similarly, voltages associated with such current values may have values of a few Volts to a few tens or hundreds of Volts.

The encapsulation material 6 may form a housing of the electronic device 200 such that the electronic device 200 may also be referred to as electronic package or semiconductor package. In particular, the electronic device 200 may be referred to as a carrier based power package or carrier based power module. In the illustrated case, the solderable surface 2 and a surface of the encapsulation material 6 may be exemplarily arranged in a common plane. In the non-limiting example of FIG. 2, the electronic device 200 may particularly correspond to a DPAK package or XDPAK package.

The encapsulation material 6 may include at least one of an epoxy, a filled epoxy, a glass fiber filled epoxy, an imide, a thermoplast, a thermoset polymer, a polymer blend, a laminate, etc. Various techniques may be used for encapsulating the components of the arrangement with the encapsulation material 6, for example at least one of compression molding, injection molding, powder molding, liquid molding, map molding, laminating, etc. During or at the end of a molding process, ejector pins may be applied, which may result in small grooves 34 on the top surface of the encapsulation material 6. The leads 16 may at least partly protrude out of the encapsulation material 6 such that encapsulated electronic components of the electronic device 200 may be electrically accessible from outside of the encapsulation material 6.

The one or multiple surface openings 4 may separate the chip carrier 12 into multiple mounting surfaces on which the electronic components of the electronic device 200 may be arranged. In the example of FIG. 2, the surface openings 4 may separate the leadframe into multiple diepads 14. In the illustrated case, the surface openings 4 may be cross shaped and may separate the leadframe into four diepads 14. The surface openings 4 may include at least one elongated surface slot. In the specific example of FIG. 2, the electronic device 200 may include two elongated surface slots substantially extending in the x-direction as well as one comparatively longer elongated surface slot substantially extending in the y-direction.

The vent openings 10 of the electronic device 200 may include one or multiple substantially circular vent holes. A diameter of the vent holes may be smaller than about mm, or smaller than about 40.0 mm, or smaller than about 30.0 mm, or smaller than about 20.0 mm, or smaller than about 10.0 mm, or even smaller than about 5.0 mm. In the example of FIG. 2, the electronic device 200 may include an exemplary number of eight vent holes 10. Two vent holes 10 may be arranged in areas of each of the two elongated surface slots 4 extending in the x-direction. In addition, four vent holes 10 may be arranged in an area of the comparatively longer elongated surface slot 4 extending in the y-direction.

FIG. 2 indicates exemplary distances between the vent holes 10. A distance between directly neighboring vent holes 10 may e.g. be in a range from about 5.0 mm to about 10.0 mm, for example about 7.5 mm. In addition, a distance between the outermost vent holes 10 in the y-direction may be in a range from about 20.0 mm to about 25.0 mm, for example 22.5 mm. In this regard, it is to be noted that the indicated dimensions are in no way limiting. Furthermore, it is understood that the above given values regarding the number of the vent holes 10, the positions of the vent holes 10 and the distances between the vent holes 10 may differ in further examples.

The vent holes 10 may fully extend through the encapsulation material 6 from the solderable surface 2 to the top surface of the electronic device 200. In particular, the vent holes 10 may exclusively extend through the encapsulation material 6 such that internal components of the electronic device 200 may not intersect with the vent holes 10 and may thus not be exposed from the encapsulation material 6. For example, it should be avoided that the vent holes 10 intersect with bond wires electrically coupling electronic components arranged over different diepads 14, such as e.g. semiconductor chips. In this context, size and location of the vent holes 10 may be restricted by the geometry of the chip carrier 12 and the location of the electronic components arranged thereon.

The vent holes 10 may be configured to provide a continuous gas connection extending through the electronic device 200 from the solderable surface 2 to a peripheral surface of the electronic device 200. That is, the vent holes 10 may be filled with nothing but ambient air. Due to such continuous gas channel extending through the electronic device 200, the vent holes 10 may be configured to provide one or multiple outgassing paths 30 when the electronic device 200 is soldered to a printed circuit board. In FIG. 2A, exemplary outgassing paths 30 are indicated by arrows substantially extending in the z-direction. Note that methods for soldering an electronic device to a printed circuit board in accordance with the disclosure are described below.

Figure 3A:
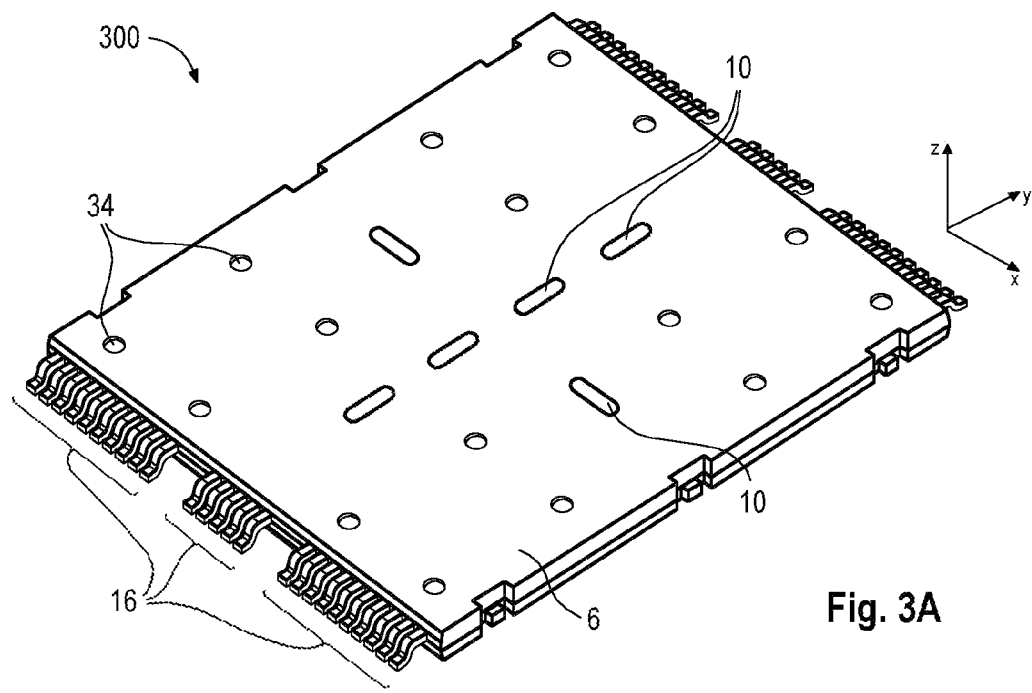
FIG. 3 includes FIGS. 3A and 3B illustrating a perspective top view and a perspective bottom view, respectively, of an electronic device in accordance with the disclosure.
Figure 3B:
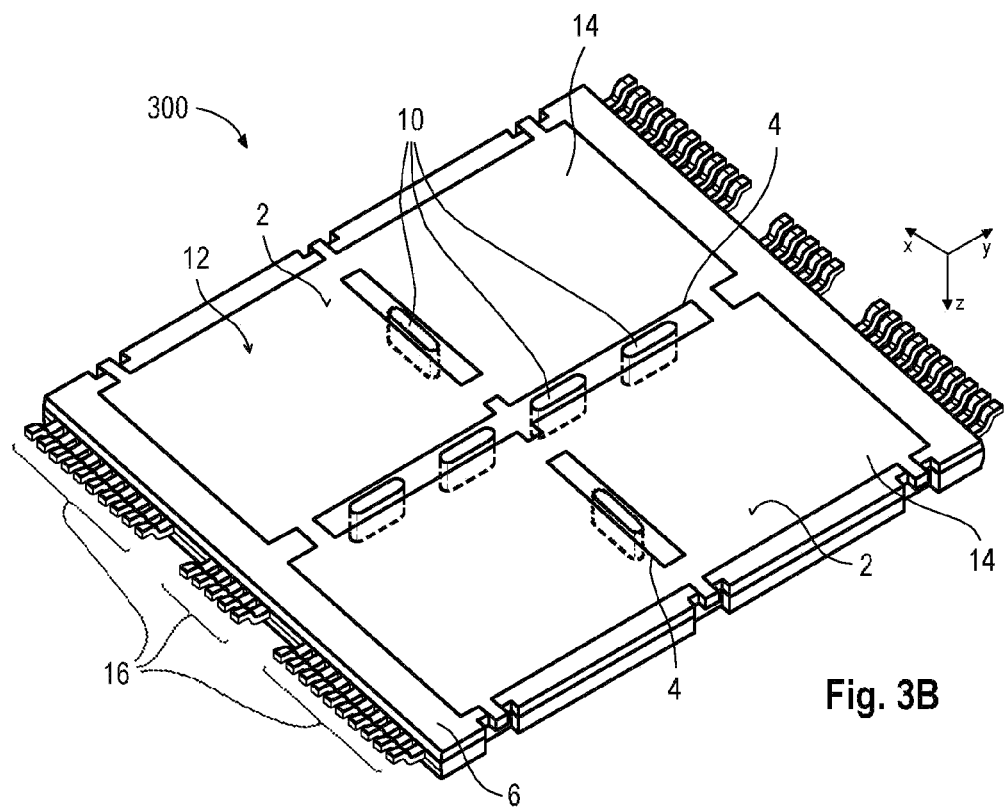

The electronic device 300 of FIG. 3 including FIGS. 3A and 3B may include some or all features of the electronic device 200 of FIG. 2 including FIGS. 2A and 2B. In contrast to FIG. 2, the vent openings 10 in FIG. 3 may have a different shape. Here, the vent openings 10 may form elongated vent slots that may substantially extend parallel to the elongated surface slots 4. Compared to the circular shaped vent holes 10 of FIG. 2, the elongated vent slots 10 of FIG. 3 may have an increased volume and may thus provide an improved outgassing performance. The vent slots 10 of FIG. 3 may be similar to the vent holes 10 of FIG. 2 at least with regard to their placement. Again, it is to be noted that the number and location of the vent slots 10 illustrated in FIG. 3 are exemplary and may differ in further examples for electronic devices in accordance with the disclosure.

Figure 4:
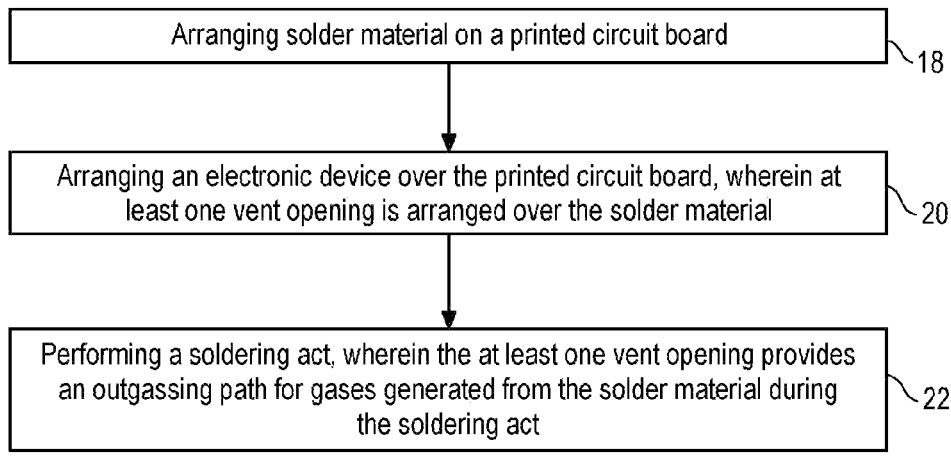
FIG. 4 illustrates a flowchart of a method for soldering an electronic device to a printed circuit board in accordance with the disclosure.

FIG. 4 illustrates a flowchart of a method for soldering an electronic device to a printed circuit board in accordance with the disclosure. For example, the electronic device may be similar to any of the electronic devices 100 to 300 described in connection with FIGS. 1 to 3. The method of FIG. 4 is described in a general manner in order to qualitatively specify aspects of the disclosure. The method may be extended by any of the aspects described in connection with other examples.

At 18, a solder material may be arranged on a printed circuit board. In a more specific case, the solder material may be separated by at least one channel. At 20, an electronic device in accordance with the disclosure may be arranged over the printed circuit board. Here, at least one vent opening may be arranged over the solder material. In the more specific case, the at least one vent opening may be arranged over the at least one channel separating the solder material. At 22, a soldering act may be performed. In one example, the solder material may include a solder paste and the soldering act may include a reflow soldering act. During the soldering act the at least one vent opening may provide an outgassing path for gases generated from the solder material.

Figure 5A:
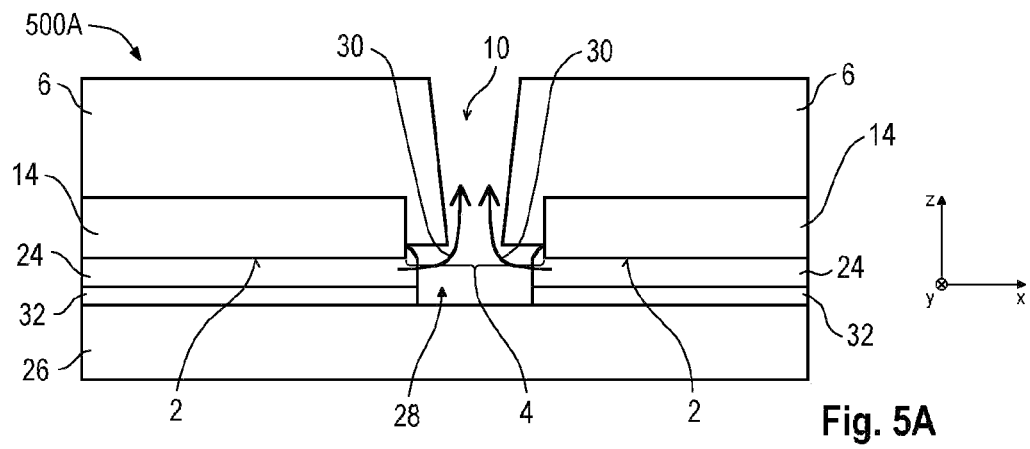
FIG. 5 includes FIGS. 5A and 5B illustrating cross-sectional side views of exemplary acts of methods for soldering electronic devices to a printed circuit board in accordance with the disclosure.
Figure 5B:
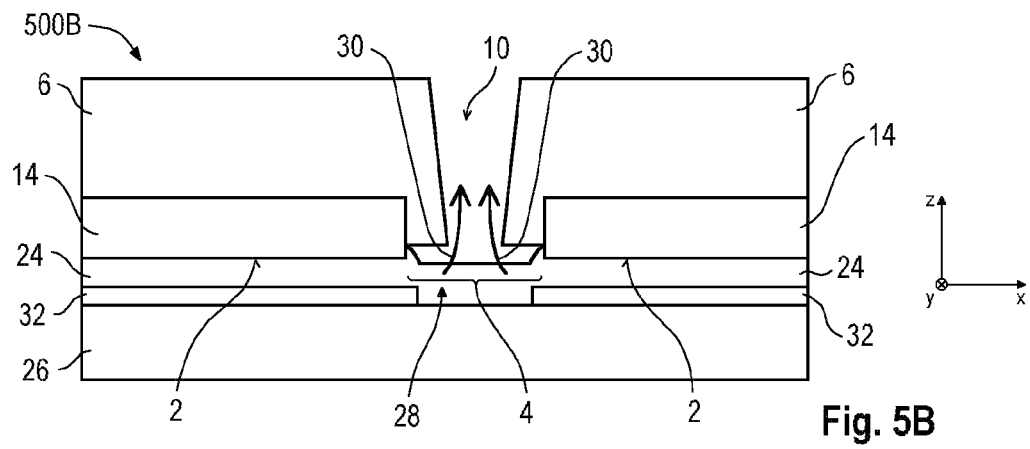

FIGS. 5A and 5B illustrate exemplary acts which may be performed in a method for soldering electronic devices 500A and 500B to a printed circuit board in accordance with the disclosure. For example, the acts of FIGS. 5A and 5B may be performed in the method of FIG. 4. The electronic devices 500A and 500B of FIGS. 5A and 5B may include some or all features of previously described electronic devices in accordance with the disclosure. For example, each of the electronic devices 500A and 500B may be at least partly similar to the electronic device 200 of FIG. 2.

In an act preceding FIG. 5A, a solder material 24 may have been arranged over one or multiple contacts pads 32 of a printed circuit board 26. For example, the solder material 24 may have been deposited on the printed circuit board 26 based on a stencil printing process, wherein a stencil thickness may e.g. be in a range from about 100 μm to about 150 μm, for example 130 μm. In particular, the solder material 24 may include or may correspond to a solder paste which may contain a mixture of powdered solder and a flux material. Due to the shape of the stencil, the solder material 24 may be separated by one or multiple channels 28. In a further act preceding FIG. 5A, the electronic device 500A may have been attached to the solder material 24, wherein the vent opening 10 may have been arranged over the channel 28 such that the vent opening 10 and the channel 28 may at least partly intersect when viewed in the z-direction.

In FIG. 5A, a footprint of the vent opening 10 may be fully arranged inside a footprint of the surface opening 4 when viewed in the z-direction. In further examples, the footprint of the vent opening 10 may be extended in the x-direction and/or y-direction. Such extension may result in an increased volume of the vent opening 10 and may thus provide an improved outgassing performance. In this context, it should however be ensured that an enlargement of the vent opening 10 in the x-direction and/or y-direction does not necessarily extend too much over the diepad 14 which may result in a loss of valuable diepad area to an unacceptable extent. As can be seen further from FIG. 5A, the encapsulation material 6 may be at least partly arranged in the surface opening 4 of the diepad 14. In particular, the encapsulation material 6 may be at least partly arranged between the solderable surface 2 and the vent opening 10.

In FIG. 5A, a soldering act may be applied to the arrangement, in particular a reflow soldering act. Here, the solder paste 24 may reflow in a molten state, thereby creating permanent solder joints electrically connecting the diepads 14 to the contact pads 32 of the printed circuit board 26. During the (reflow) soldering act, gases may be generated from the solder material 24. The gases may escape into the environment via the channel 28 and the vent opening 10. In FIG. 5A, exemplary outgassing paths 30 for the gases are indicated by arrows extending from the solder material 24 to the vent opening 10.

The exemplary act of FIG. 5B may be at least partly similar to the act of Figure such that comments made in connection with FIG. 5A may also hold true for the example of FIG. 5B. In contrast to FIG. 5A, the solder material 24 in FIG. 5B (or at least the illustrated portion thereof) may not necessarily include channels arranged under the vent opening 10. That is, the solder material 24 may not necessarily require a specific structuring as e.g. provided by a selective stencil printing process. Rather, the solder material 24 may be applied in a uniform fashion and may continuously extend under the vent opening 10. Similar to FIG. 5A gases generated during a soldering act may escape into the environment via the vent opening 10.

Figure 6:
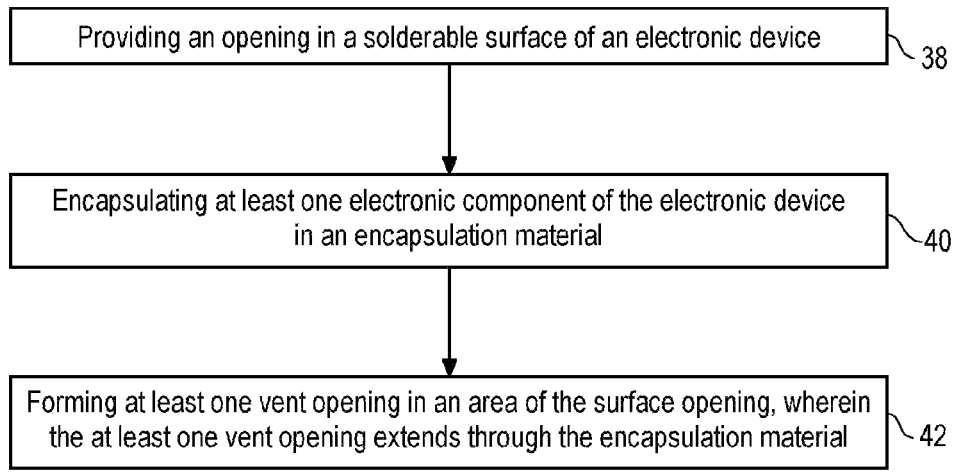
FIG. 6 illustrates a flowchart of a method for manufacturing an electronic device in accordance with the disclosure.

FIG. 6 illustrates a flowchart of a method for manufacturing an electronic device in accordance with the disclosure. The method is described in a general manner in order to qualitatively specify aspects of the disclosure. The method may be extended by any of the aspects described in connection with other examples in accordance with the disclosure. For example, the method may be used for manufacturing any of the electronic devices 100 to 300 described in connection with FIGS. 1 to 3.

At 38, an opening may be provided in a solderable surface of the electronic device. At 40, at least one electronic component of the electronic device may be encapsulated in an encapsulation material. At 42, at least one vent opening may be formed in an area of the surface opening, wherein the at least one vent opening extends through the encapsulation material.

Figure 7A:
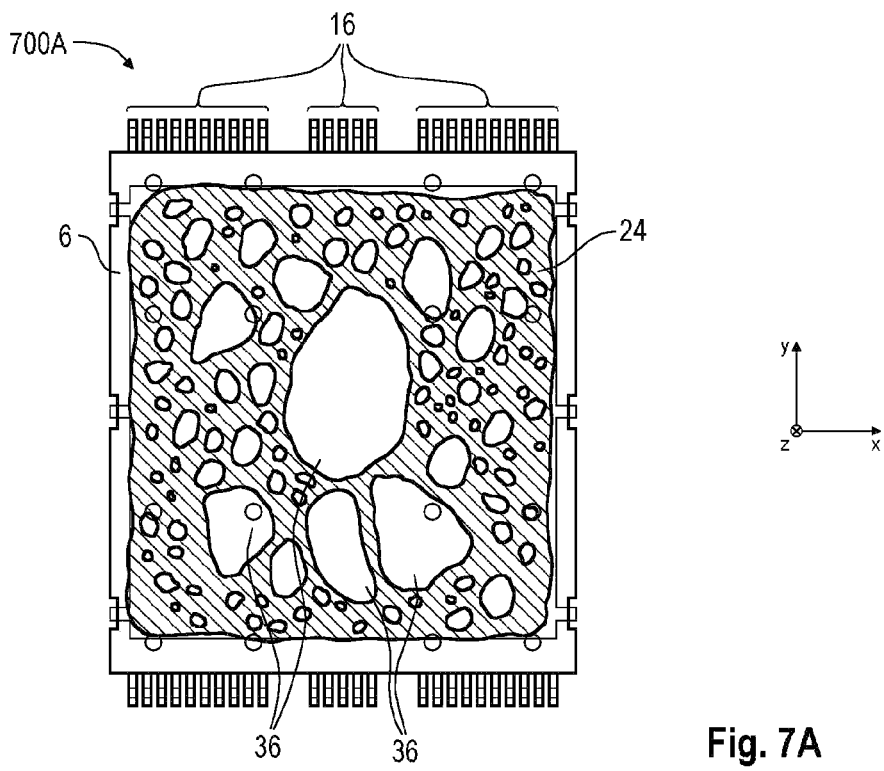
FIG. 7 includes FIGS. 7A to 7C illustrating simulation results for void concentrations in various scenarios.
Figure 7B:
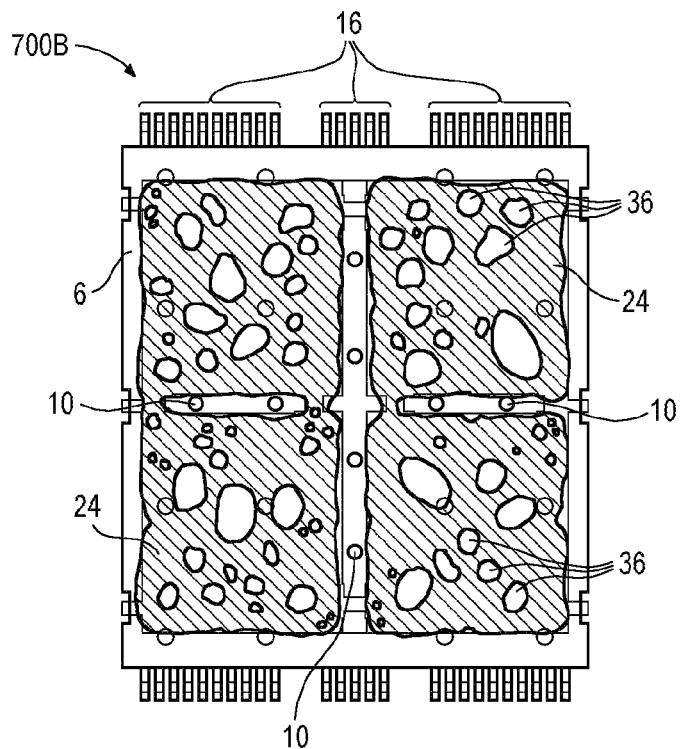
Figure 7C:
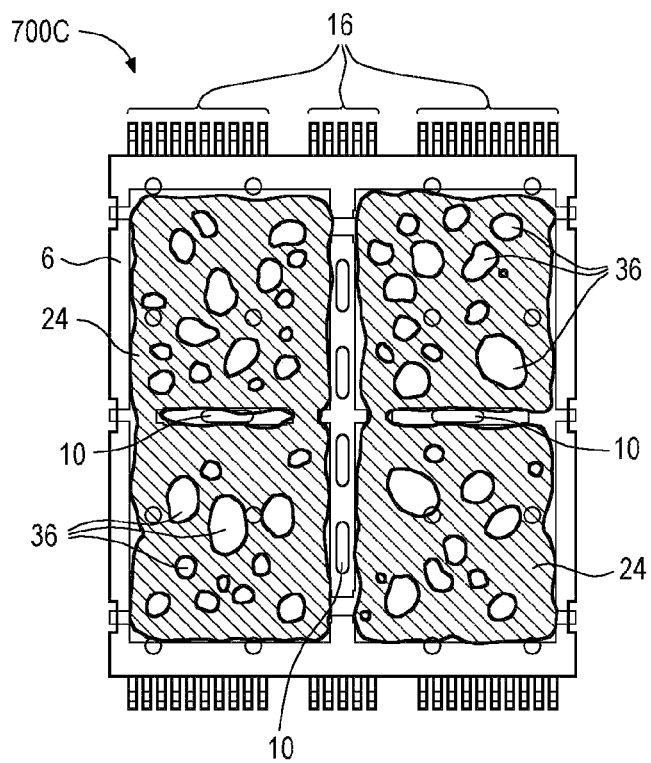

FIG. 7 includes FIGS. 7A to 7C illustrating simulation results for void concentrations in various scenarios. FIGS. 7A to 7C show bottom views of electronic devices 700A to 700C, respectively, soldered to a printed circuit board (not illustrated). During a soldering process, multiple solder voids 36 may have been formed in the solder material 24. In this context, a total void ratio may be specified as a ratio of the volume of all voids in the solder material 24 and the total volume of the solder material 24. In addition, a maximum single void ratio may be specified as a ratio of the volume of the largest void in the solder material 24 and the total volume of the solder material 24.

The electronic device 700A of FIG. 7A does not include surface openings and vent openings as described in connection with electronic devices in accordance with the disclosure. That is, essentially the entire bottom surface of the chip carrier of the electronic device 700A may be closed. As can be seen from FIG. 7A, a huge solder void 36 having a maximum volume among the plurality of solder voids 36 may have been formed over the center of the bottom surface of the electronic device 700A. Such huge solder void 36 may particularly result from an occurring warpage of the electronic device 700A. In the scenario of FIG. 7A, performed simulations may provide void concentration values of about 0.12 (or about 12%) for the maximum single void ratio and about 0.42 (or about 42%) for the total void ratio.

The electronic device 700B of FIG. 7B may e.g. be similar to the electronic device 200 of FIG. 2. That is, the electronic device 700B may include surface openings 4 and substantially circular vent holes 10. As can be seen from FIG. 7B, the huge center solder void of FIG. 7A may be avoided. In the scenario of FIG. 7B, performed simulations may provide void concentration values of about 0.042 (or about 4.2%) for the maximum single void ratio and about 0.17 (or about 17%) for the total void ratio. A comparison between these values and the simulation results of FIG. 7A reveals that using vent holes 10 may increase an outgassing performance, thereby reducing both void concentration values. In this regard, integration of the vent holes 10 may help to reduce the warpage of the electronic device (or package) such that less package stress may occur. Due to the reduced warpage, the bondline thickness may become more uniform.

The electronic device 700C of FIG. 7C may e.g. be similar to the electronic device 300 of FIG. 3. That is, the electronic device 700C may include surface openings 4 and elongated vent slots 10. Similar to FIG. 7B, a huge center solder void may be avoided. In the scenario of FIG. 7C, performed simulations may provide exemplary void concentration values of about 0.04 (or about 4.0%) for the maximum single void ratio and about 0.141 (or about 14.1%) for the total void ratio. Comparing these values to the results of FIG. 7B shows that vent slots may provide an additional benefit over substantially circular vent holes.

EXAMPLES

In the following, electronic devices, methods for soldering an electronic device to a printed circuit board as well as methods for manufacturing an electronic device will be explained by means of examples.

Example 1 is an electronic device, comprising: a solderable surface; at least one surface opening arranged in the solderable surface; an encapsulation material encapsulating at least one electronic component of the electronic device; and at least one vent opening arranged in an area of the surface opening and extending through the encapsulation material.

Example 2 is an electronic device according to Example 1, wherein the solderable surface is part of a chip carrier and the at least one electronic component is arranged over a surface of the chip carrier arranged opposite to the solderable surface.

Example 3 is an electronic device according to Example 1 or 2, wherein the solderable surface is arranged at a periphery of the electronic device.

Example 4 is an electronic device according to one of the preceding Examples, wherein the solderable surface is configured for soldering the electronic device to a printed circuit board.

Example 5 is an electronic device according to one of the preceding Examples, wherein the vent opening provides a continuous gas connection through the electronic device from the solderable surface to a peripheral surface of the electronic device.

Example 6 is an electronic device according to one of the preceding Examples, wherein the at least one vent opening is configured to provide an outgassing path when soldering the electronic device to a printed circuit board.

Example 7 is an electronic device according to one of the preceding Examples, wherein the at least one surface opening comprises at least one elongated surface slot.

Example 8 is an electronic device according to one of Examples 2 to 7, wherein the at least one surface opening separates the chip carrier into multiple mounting surfaces and the at least one electronic component is arranged on one or multiple of the multiple mounting surfaces.

Example 9 is an electronic device according to one of Examples 2 to 8, wherein the chip carrier comprises a leadframe and the at least one surface opening separates the leadframe into multiple diepads.

Example 10 is an electronic device according to Example 9, wherein the at least one surface opening is cross shaped and separates the leadframe into four diepads.

Example 11 is an electronic device according to one of the preceding Examples, wherein the at least one vent opening comprises at least one elongated vent slot.

Example 12 is an electronic device according to one of the preceding Examples, wherein the at least one vent opening comprises at least one substantially circular vent hole.

Example 13 is an electronic device according to one of the preceding Examples, wherein, in a top view of the solderable surface, a footprint of the at least one vent opening is fully arranged inside a footprint of the at least one surface opening.

Example 14 is an electronic device according to one of the preceding Examples, wherein the encapsulation material is at least partly arranged in the at least one surface opening.

Example 15 is an electronic device according to one of the preceding Examples, wherein the encapsulation material is at least partly arranged between the solderable surface and the at least one vent opening.

Example 16 is an electronic device according to one of the preceding Examples, wherein the at least one vent opening exclusively extends through the encapsulation material.

Example 17 is an electronic device according to one of the preceding Examples, wherein the solderable surface and a surface of the encapsulation material are arranged in a common plane.

Example 18 is an electronic device according to one of the preceding Examples, wherein the electronic device is a surface mount device.

Example 19 is a method for soldering an electronic device to a printed circuit board, the method comprising: arranging solder material on a printed circuit board; arranging an electronic device according to one of the preceding Examples over the printed circuit board, wherein the at least one vent opening is arranged over the solder material; and performing a soldering act, wherein the at least one vent opening provides an outgassing path for gases generated from the solder material during the soldering act.

Example 20 is a method according to Example 19, wherein: the solder material is separated by at least one channel, and the at least one vent opening is arranged over the at least one channel.

Example 21 is a method according to Example 19 or 20, wherein the solder material comprises a solder paste and the soldering act comprises a reflow soldering act.

Example 22 is a method for manufacturing an electronic device, the method comprising: providing an opening in a solderable surface of the electronic device; encapsulating at least one electronic component of the electronic device in an encapsulation material; and forming at least one vent opening in an area of the surface opening, wherein the at least one vent opening extends through the encapsulation material.

As employed in this specification, the terms "connected", "coupled", "electrically connected", and/or "electrically coupled" may not necessarily mean that elements must be directly connected or coupled together. Intervening elements may be provided between the "connected", "coupled", "electrically connected", or "electrically coupled" elements.

Further, the word "over" used with regard to e.g. a material layer formed or located "over" a surface of an object may be used herein to mean that the material layer may be located (e.g. formed, deposited, etc.) "directly on", e.g. in direct contact with, the implied surface. The word "over" used with regard to e.g. a material layer formed or located "over" a surface may also be used herein to mean that the material layer may be located (e.g. formed, deposited, etc.) "indirectly on" the implied surface with e.g. one or multiple additional layers being arranged between the implied surface and the material layer.

Furthermore, to the extent that the terms "having", "containing", "including", "with", or variants thereof are used in either the detailed description or the claims, such terms are intended to be inclusive in a manner similar to the term "comprising". That is, as used herein, the terms "having", "containing", "including", "with", "comprising", and the like are open-ended terms that indicate the presence of stated elements or features, but do not preclude additional elements or features. The articles "a", "an", and "the" are intended to include the plural as well as the singular, unless the context clearly indicates otherwise.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or multiple" unless specified otherwise or clear from context to be directed to a singular form. Also, at least one of A and B or the like generally means A or B or both A and B.

Devices and methods for manufacturing devices are described herein. Comments made in connection with a described device may also hold true for a corresponding method and vice versa. For example, if a specific component of a device is described, a corresponding method for manufacturing the device may include an act of providing the component in a suitable manner, even if such act is not explicitly described or illustrated in the figures.

Although the disclosure has been shown and described with respect to one or multiple implementations, equivalent alterations and modifications will occur to others skilled in the art based at least in part upon a reading and understanding of this specification and the annexed drawings. The disclosure includes all such modifications and alterations and is limited only by the concept of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or multiple other features of the other implementations as may be desired and advantageous for any given or particular application.

The invention claimed is:

1. An electronic device, comprising:
    a solderable surface;
    at least one surface opening arranged in the solderable surface;
    an encapsulation material encapsulating at least one electronic component of the electronic device; and
    at least one vent opening arranged in an area of the surface opening and extending through the encapsulation material.

2. The electronic device of claim 1, wherein the solderable surface is part of a chip carrier and the at least one electronic component is arranged over a surface of the chip carrier arranged opposite to the solderable surface.

3. The electronic device of claim 1, wherein the solderable surface is arranged at a periphery of the electronic device.

4. The electronic device of claim 1, wherein the solderable surface is configured for soldering the electronic device to a printed circuit board.

5. The electronic device of claim 1, wherein the vent opening provides a continuous gas connection through the electronic device from the solderable surface to a peripheral surface of the electronic device.

6. The electronic device of claim 1, wherein the at least one vent opening is configured to provide an outgassing path when soldering the electronic device to a printed circuit board.

7. The electronic device of claim 1, wherein the at least one surface opening comprises at least one elongated surface slot.

8. The electronic device of claim 2, wherein the at least one surface opening separates the chip carrier into multiple mounting surfaces and the at least one electronic component is arranged on one or multiple of the multiple mounting surfaces.

9. The electronic device of claim 2, wherein the chip carrier comprises a leadframe and the at least one surface opening separates the leadframe into multiple diepads.

10. The electronic device of claim 9, wherein the at least one surface opening is cross shaped and separates the leadframe into four diepads.

11. The electronic device of claim 1, wherein the at least one vent opening comprises at least one elongated vent slot.

12. The electronic device of claim 1, wherein the at least one vent opening comprises at least one substantially circular vent hole.

13. The electronic device of claim 1, wherein, in a top view of the solderable surface, a footprint of the at least one vent opening is fully arranged inside a footprint of the at least one surface opening.

14. The electronic device of claim 1, wherein the encapsulation material is at least partly arranged in the at least one surface opening.

15. The electronic device of claim 1, wherein the encapsulation material is at least partly arranged between the solderable surface and the at least one vent opening.

16. The electronic device of claim 1, wherein the at least one vent opening exclusively extends through the encapsulation material.

17. The electronic device of claim 1, wherein the solderable surface and a surface of the encapsulation material are arranged in a common plane.

18. The electronic device of claim 1, wherein the electronic device is a surface mount device.

19. A method for soldering an electronic device to a printed circuit board, the method comprising:
    arranging solder material on a printed circuit board;
    arranging an electronic device according to claim 1 over the printed circuit board, wherein the at least one vent opening is arranged over the solder material; and
    performing a soldering act, wherein the at least one vent opening provides an outgassing path for gases generated from the solder material during the soldering act.

20. The method of claim 19, wherein:
    the solder material is separated by at least one channel; and
    the at least one vent opening is arranged over the at least one channel.

21. The method of claim 19, wherein the solder material comprises a solder paste and the soldering act comprises a reflow soldering act.

22. A method for manufacturing an electronic device, the method comprising:
    providing an opening in a solderable surface of the electronic device;
    encapsulating at least one electronic component of the electronic device in an encapsulation material; and
    forming at least one vent opening in an area of the surface opening, wherein the at least one vent opening extends through the encapsulation material.

\* \* \* \* \*